(12) United States Patent
Kuhara et al.

(10) Patent No.: US 6,558,048 B2
(45) Date of Patent: May 6, 2003

(54) LD MODULE

(75) Inventors: Yoshiki Kuhara, Osaka (JP); Hiromi Nakanishi, Osaka (JP); Manabu Yoshimura, Kanagawa (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 193 days.

(21) Appl. No.: 09/826,875

(22) Filed: Apr. 6, 2001

(65) Prior Publication Data

US 2001/0055451 A1 Dec. 27, 2001

(30) Foreign Application Priority Data

May 19, 2000 (JP) ........................................ 2000-147867

(51) Int. Cl.7 ............................... G02B 6/42; G02B 6/32
(52) U.S. Cl. ........................................... 385/93; 385/33
(58) Field of Search ............................... 385/33, 35, 88, 385/92–94

(56) References Cited

U.S. PATENT DOCUMENTS 6,345,138 B1 * 2/2002 Kawai et al. .................. 385/49
2002/0141682 A1 * 10/2002 Ryu et al. ..................... 385/14

FOREIGN PATENT DOCUMENTS

| JP | 2195309 | 8/1990 |
| JP | 961652 | 3/1997 |
| JP | 11220220 | 8/1999 |

OTHER PUBLICATIONS

Yoshio Itaya, et al., "*Optical Semiconductor Devices for Hybrid Modules,*" NTT R & D, vol. 46, No. 5, 1997, pp. 487 (79)—490 (82). (Japanese language with English abstract located on p. 487 (79)).

Y. Inaba, et al., "*1.3 µm Tapered–Active–Stripe Laser with Low Threshold and High Slope Effeciency,*" Technical Report of IEICE. EMD97–43, CPM97–81, OPE97–59, LQE97 (Aug. 1997), pp. 81–86.(Japanese language with English abstract located on p. 81).

Yoshio Itaya, et al., "*Spot–size Converted Lasers (SSC–LD),*" Techical Report of IEICE. OPE95–140, LQE95–134 (Feb. 1996), pp. 31–36. (Japanese language with English abstract located on p. 31).

Nobuaki Hiraguri, et al., "*Coupling Characteristics Between Integration–Oriented Lensed Fibers and LD's with Narrow Beam Divergence,*" Technical Report of IEICE. EMD97–44, CPM97–82, OPE97–60 LQE97–56 (Aug. 1997), pp. 87–92. (Japanese language with English abstract located on p. 87). Science Forum Corporation published Feb. 29, 1996 and its English Translation entitled "*Section I: Optical Devices for Digital Communication*".

* cited by examiner

Primary Examiner—John D. Lee
Assistant Examiner—Sarah U Song
(74) Attorney, Agent, or Firm—Smith, Gambrell & Russell, LLP

(57) ABSTRACT

An LD module having a spot-size conversion LD for emitting a beam of a small aperture angle, an optical fiber or a waveguide and a lens for converging the LD beam to the fiber or the waveguide.

16 Claims, 8 Drawing Sheets beam aperture angle 35° beam aperture angle 12°

Embodiment 3

Embodiment 4

Embodiment 5

LD MODULE

BACKGROUND OF THE INVENTION

1. Field of the Invention

This invention relates to an LD (laser diode) module, in particular, a low-cost, small-sized and high-performance LD module which is utilized in optical communication systems.

This application claims the priority of Japanese Patent Application No.2000-147867 filed on May 19, 2000 which is incorporated herein by reference.

2. Description of Related Art

FIG. 1 shows a prior art LD module 1 which is sealed in a vertical metal case. This is one of the most prevalent LD modules at present. The transmitting (LD) module 1 has a metallic package. A circular metal stem 2 has a pole 3 erected near the center. An LD (laser diode) 4 is bonded on a side of the pole 3. A top incidence type PD 5 is mounted with a light receiving surface upward at the center of the stem 2. A cylindrical metal cap 6 is welded on the stem 2 for covering the LD 4 and the PD 5. The cap 6 has a top opening 7 for guiding the LD light outward.

A metallic cylindrical lens holder 8 is welded outside of the cap 6 upon the stem 2 for supporting a lens 9 just above the LD 4. A conical ferrule holder 10 is further welded upon the lens holder 8 for maintaining a ferrule 12 at an axial hole. The ferrule 12 holds an end of an optical fiber 11. The LD 4 emits light from both ends in both directions. The LD light has a wide aperture with wide diverging angles. Front light emitted from the front end is converged and guided by the lens 9 to the end of the fiber 11. The front light is signal light. The ends of the fiber and the ferrule are ground slantingly for prohibiting the light reflected at the end from returning to the LD and inducing instability of the LD oscillation. Such a metal packaged three dimensional LD module is still in prevalent, influential use at present. The metal case can hermetically seal the LD chips or the PD chip completely. The metal package prevents corrosive water or oxygen from invading into the package. The hermetic seal protects the module from oxidization or corrosion of the chips, the patterns or the wires. The metal case brings about a long lifetime and high reliability to the module. The metal package is a standardized one which reduces the part cost. The prior LD module of FIG. 1 is still an excellent one.

Further, prevalence of the optical networks strenuously requires lower-cost and smaller-size optoelectronic modules than the metal packaged modules. An improvement of LD modules is a purpose of the present invention. The Inventors are interested in the structure of LDs (laser diodes). Conventional LD modules have commonplace, cheap LD chips having a uniform emission stripe with a constant width w and a constant thickness d extending in the longitudinal direction (z-direction). The emission stripe means a spatially-restricted, active layer which makes laser light by the stimulated emission induced by an electric current injection. FIG. 2 shows a schematic structure of a conventional LD chip for showing only the active layer (stripe) clearly in a perspective view. This is a simple Fabbry-Perrow laser diode. The LD generates light power by inducing light by the injected current, amplifying the light in-phase by the repetitions of propagation in the stripe and reflections at the ends (mirrors) and leaking a part of the amplified light out of the (half-mirror) end. Some sophisticated LDs have light waveguides with a periodical saw-teeth shape upon the stripes for selecting the wavelength more strictly. The shape of the stripe itself is the uniform stripe same as the cheap one of FIG. 2.

For example, an LD emitting 1.3 $\mu$m wavelength light has a 300 $\mu$m length, a 300 $\mu$m width and a 100 $\mu$m thickness. The active layer (emission stripe) of the LD chips has e.g., a 1.2 $\mu$m width, a 0.2 $\mu$m thickness and a 300 $\mu$m length (cavity length). The active layer is otherwise called a "cavity", a "stripe", an "emission stripe" or a "resonator". All the terms signify the same matter. In the prior LD chip in FIG. 2, the width and the thickness of the active layer are constant in the full length. The length of the stripe determines the wavelength of the emitted light. The width and the thickness determine the aperture of the light. The LD light disperses in a wide angle. The aperture angle of the light emitted from the stripe is about 30 degrees to 40 degrees. The wide beam spread is one of the drawbacks of the current LDs. The LD wide beam dispersion sometimes induces difficulties.

An optical fiber consists of a core and a cladding. The core has a 10 $\mu$m diameter in a single-mode fiber for the 1.3 $\mu$m band light. The cladding has a 125 $\mu$m diameter. The LD active layer (w=1.2 $\mu$m, d=0.2 $\mu$m) is smaller than the fiber core (10 $\mu$m) in section. But almost all of the LD light escapes from the fiber and dissipates in vain due to the wide dispersion (30° to 40°) of the LD light, even if the fiber is brought into direct contact with the LD without gap. A lens, therefore, is indispensable for the coupling of an LD to a fiber.

FIG. 1 denotes the lens 9 of converging the dispersing LD light into the end of the fiber 11 for joining the fiber 11 to the LD 4 on an optimum condition. The LD module 1 utilizes a spherical lens having convex spherical curves on both surfaces as converging optics. Sophisticated LD modules employ aspherical lenses for enhancing the coupling efficiency further. Inexpensive LD modules use a ball lens for facilitating the assembly and reducing the cost. In any cases, the three-dimensional structure LD modules require converging optics.

The solid-structured LD module of FIG. 1 is encapsulated in a metal package of a 5.6 mm outer diameter. The LD 4 is a common cheap chip with a uniform stripe as denoted in FIG. 2. An active layer 14 is shown in a chip 13 in a perspective view. As described before, the inexpensive commonplace LD chips have the uniform active layer having a constant breadth w and a constant thickness d. The uniform stripe forgives the light dispersing in a wide aperture. LD modules require converging optics for coupling the LD to the fiber. The converging optics is a ball lens, a spherical lens or an aspherical lens. Low-power, inexpensive modules adopt ball lenses for joining the LD to the fiber.

A ball lens is inexpensive but has large aberration. The aberration prevents the ball lens from heightening the coupling efficiency up to the maximum. Conventional ball lenses allow the LD driving current of about 30 mA to produce an output power of 0.2 mW to 0.5 mW at another fiber end. Thus, the ball lens convergence optics are mainly employed for low-power, low-cost, low-speed and short-range optical communication networks.

On the contrary, high-power, long-range optical communication networks require aspherical lenses for the convergence optics. Aspherical lenses can suppress all kinds of aberration to low levels. The use of the aspherical lens enables the same 30 mA LD driving current to make a 1 mW to 2 mW output power at another fiber end. The coupling efficiency is enhanced several times by the aspherical lens. Aspherical lenses, however, are expensive. The aspherical lenses are used in mainstream fiber cable lines or equipment in central stations.

The ball lens optics and the aspherical lens optics are chosen by the criterion whether the module should be a low-cost, low-power one or a high-cost, high-power one. One purpose of the present invention is to provide a low-cost, high-power, small-size, high-value added LD module. Another purpose of the present invention is to provide an inexpensive ball-lens converging LD module with as high power as the expensive aspherical lens converging LD module. A further purpose of the present invention is to provide an inexpensive ball lens LD loaded module with higher coupling efficiency than the conventional ball lens loaded LD module.

Preparatory descriptions are required for showing the idea of the present invention. A novel type of laser diode has been proposed for coupling the LD to a fiber without convergence optics. The new LD is called a "spot-size converted laser diode". The new SSC-LD has an advantage of eliminating convergence optics from the coupling between an LD and an optical fiber. The present invention is not directed to an improvement of SSC-LDs but to an improvement of LD modules. But the present invention makes use of the novel SSC-LD. The SSC-LDs are not well known even in the skilled.

The SSC-LD is now described before starting the description of the present invention. In short, the SSC-LD has a tapered end stripe produced by reducing the width or the thickness for enlarging the output beam size. Since the LD enlarges the spot size, the LD is called "spot size converted" LD. In spite of the term "converted", the SSC-LD does not reduce the beam size but only increases the beam spot size. There are two kinds of the SSC-LDs. One is a width-narrowing SSC-LD, which is called a "horizontally-tapered" SSC-LD. The other is a thickness-reducing SSC-LD, which is named a "vertically-tapered" SSC-LD.

FIG. 3 shows a vertically-tapered SSC-LD. An LD chip 13 has an active layer 14 with a reducing thickness d toward the front end. The width w of the stripe is constant along the axial line. A coordinate is defined to be z=0 at the rear end, z=L at the front end and z=$L_1$ at the starting point of the taper (0<$L_1$<L). L is the length of the LD. (L–$L_1$) is the length of a tapering portion 15 of the active layer 14. The top-tapered SSC-LD gives the stripe the width w(z) and the thickness d(z) as functions of z, $$0 \leq z \leq L \quad w(z)=w_o, \tag{1}$$

$$0 \leq z \leq L_1 \quad d(z)=d_o, \tag{2}$$

$$L_1 \leq z \leq L \quad d(z)=d_o-\alpha(z-L_1), \tag{3}$$

$$\alpha>0, \quad d_o-\alpha(L-L_1)>0. \tag{4}$$

Here, α is an inclination angle of the tapered end of the stripe. Inequality (4) signifies a definite thickness at the front end (z=L). The narrowing active layer cannot enclose the light completely and allows the light to leak from the active layer. The leak of the light power out of the stripe layer increases the beam diameter. The (beam) spot size is enlarged by the tapered stripe. Since the sectional area is enlarged, the dispersion angle of the beam is reduced to the contrary. The beam spot size is inversely proportional to the beam dispersion angle. The reduction of the dispersion angle is important for the SSC-LDs.

FIG. 4 shows a horizontally-tapered SSC-LD. The thickness d of the active layer is constant. The breadth w is narrowed toward the front end. A coordinate is defined to be z=0 at the rear end, z=L at the front end and z=$L_2$ at the starting point of the taper (O<$L_2$<L). L is the length of the LD. (L–$L_2$) is the length of a tapering portion 16 of the active layer 14. In the horizontally-tapered SSC-LD, the stripe 14 has the width w(z) and the thickness d(z) as functions of z, $$0 \leq z \leq L \quad d(z)=d_o, \tag{5}$$

$$0 \leq z \leq L_2 \quad w(z)=w_o, \tag{6}$$

$$L_2 \leq z \leq L \quad w(z)=w_o-\beta(z-L_2), \tag{7}$$

$$\beta>0, \quad w_o-\beta(L-L_2)>0. \tag{8}$$

Here, β is a reduction angle of the tapered sides of the stripe. Inequality (8) signifies a definite width at the front end (z=L). The narrowing active layer induces insufficient enclosure of the light. The leak of the light from the active layer enlarges the beam spot size. The increase of the spot size reduces the beam spreading angle. Both the SSC-LDs (FIG. 3 and FIG. 4) have a function of reducing the beam spreading angle.

Introduction of the Spot Size-converted Laser Diode

The SSC-LD is not an entirely novel device but is not well known for the skilled in art yet. The fact requires some description of the SSC-LD. Conventional LDs emit small size spot beams with large dispersion angles. A lens is indispensable for the prior LD modules with the conventional LDs. The use of the lens, however, raises the part cost, the assembling cost and the package cost. Elimination of the lens enables the LD module to reduce the cost. The purpose of contriving the SSC-LD is to eliminate the lens form LD devices.

It is desired to combine an optical fiber to an LD without lens. Small dispersion of the LD beam seems to be sufficient for the non-lens coupling between the fiber and the LD. In fact, the LD stripe has a small breadth (1.21 μm) and a small thickness (0.21 μm). Someone may suppose that the direct touching of the fiber to the LD would introduce the LD light into the fiber with high efficiency. But it is not true. The excess size difference between the fiber and the LD impedes the introduction of the LD beam into the fiber. If the beam size of the laser is enlarged up to the size of the fiber core, the coupling efficiency will be raised.

If the waveguide of the LD is narrowed, the power of localizing the light power within the waveguide is weakened. The decline of localizing the light power into the waveguide core allows the light power to pervade outside of the waveguide of the LD stripe. The diffused light power will enhance the coupling efficiency between the LD and the fiber. The SSC-LD with the narrowed stripe (waveguide) aims at enhancing the coupling efficiency by enlarging the LD beam spot size near the fiber core size through the narrowed stripe. Thus, such a laser diode is called a spot-size converted laser diode (SSC-LD). An increase of the spot size (beam diameter) will invite a decrease of the aperture of the beam. The narrow aperture will enable the LD to introduce the light power into the fiber with high efficiency without converging lens.

The SSC-LD with the narrow stripe end was invented from the idea of decreasing the aperture angle by increasing the beam (spot) size through the narrowness of the stripe. The end of the active stripe is sharpened for decreasing the aperture angle of the emission beam in the improved LD as shown in FIG. 3 and FIG. 4. Various contrivances have been suggested for improving the SSC-LDs.

① Japanese Patent Laying Open No.9-61652, "A semiconductor waveguide and a method of making same", proposes a tapered waveguide and an improved LD having a tapered waveguide as an active stripe. The single tapered waveguide can convert the spot size by coupling to a conventional laser diode (LD).

②  Japanese Patent Laying Open No.11-220220, "A semiconductor laser and a method of making same", suggests an LD having an active layer with a narrowing width, as shown in FIG. 4. The narrowing angle β of inequality (8) is less than 0.14 degree. The narrowing width enables the LD to generate a narrow aperture beam.

③ Yoshio Itaya, Toshihiko Sugie, Mitsuo Yamamoto, "Spot-size converted lasers (SSC-LD)", Technical Report of IEICE (The Institute of Electronics, Information and Communication Engineers), OPE95-140, LQE95-134 (1996-2), p31, makes SSC-LDs on a two-inch InP wafer. The SSC-LD has a 600 μm length and a 300 μm width. The active layer (emission stripe) is gradually reduced from 1.5 μm to 0.3 μm. The SSC-LD is coupled to a light waveguide without lens. The coupling loss is 1.2 dB to 2.5 dB. The coupling loss is sufficiently small.

④ Y. Inaba, M. Kito, M. Ishino, T. Chino, T. Nishikawa, T. Uno, Y. Matsui, "1.3 μm tapered-active-stripe laser with low threshold and high slope efficiency", Technical Report of IEICE (The Institute of Electronics, Information and Communication Engineers), EMD97-43, CPM97-81, OPE97-59, LQE97-55(1997-08), p81, proposes SSC-LDs having a active layer with a narrowing width. The tapering width of the active layer is 0.61 μm at the front end and 1.6 μm~2.6 μm at the rear end. Various SSC-LDs having a variety of tapering angles are made. The SSC-LDs are coupled to a fiber without lens. The coupling efficiency is measured by changing the distance between the SSC-LD and the fiber end. The maximum coupling efficiency is −4.7 dB at an optimum distance. The range of ±3 μm from the optimum distance obtains coupling efficiency of higher than −4.7 dB. The coupling efficiency of the conventional LDs to fibers is −9 dB at the highest. Thus the SSC-LD obtains an extra increase of 4 dB of coupling efficiency in comparison to the conventional LDs.

⑤ Yoshio Itaya, Osaake Nakajima, Mitsuru Naganuma, Mitsuo Fukuda, Kiyoyuki Yokoyama, Hiromu Toba, "Optical Semiconductor Devices for Hybrid Modules", NTT R&D, vol.46, No.5, 1997, p487-490, proposes a spot-size converter laser diode (SSC-LD) having a tapering active stripe layer with a reducing thickness end. The thickness of the active layer is 0.3 μm in the oscillating region but is reduced to 0.1 μm at the front end. The active layer has a constant width of 1.5 μm. The half width angle of the emission aperture of the laser is 6 degrees to 9 degrees. The full aperture angle is 12 degrees to 18 degrees. In the conventional laser diodes with a constant stripe, the beam aperture is 30 degrees to 40 degrees. The SSC-LD succeeds in confining the LD beam within about a half angle of the conventional LD aperture.

⑥ "Light/microwave semiconductor application technology", Science Forum Corporation published Feb. 29, 1996, first print, first copy, p165, "Digital Communication Devices", takes a review of the spot-size conversion laser diodes. The report says that the conventional LDs emit wide beams with an aperture angle of 33 degrees but the SSC-LDs make narrow beams of a 9 degree aperture angle. The review writes that the loss of the non-lens coupling is about 10 dB for the conventional LDs and about 4 dB for the SSC-LDs.

⑦ Japanese Patent Laying Open No.2-195309, "Photocoupling device", proposes a passive device with the spot-size conversion function. The device has a substrate with width-varying waveguides having the spot-size conversion function. Instead of coupling a fiber to another fiber with a lens, the invention employs the proposed SSC-waveguide for coupling a fiber to another fiber. An increase of the core width w results in a reduction of the beam size (spot size) in the waveguide. A decrease of the core width w invites an increment of the beam size. The fibers are coupled by the light waveguide having a narrow core intermediate part and wide core ends. The wide core ends enhance the coupling efficiency through the reduction of the beam sections at both ends.

⑧ Nobuaki Hiraguri, Kazuo Shiraishi, "Coupling characteristics between integration-oriented lensed fibers and LD's with narrow beam divergence", Technical Report of IEICE (The Institute of Electronics, Information and Communication Engineers), EMD97-44, CPM97-82, OPE97-60, LQE97-56(1997-08), p87, proposes a ball-lensed fiber coupling to the SSC-LD (LD's with narrow beam divergence) with high coupling efficiency. The fiber is called a "ball-lensed fiber" since it has an end being shaped in a ball lens. A fiber is ball-lensed by melting an end of the fiber by oxygen-hydrogen flame. The molten glass makes a ball at the end by the surface tension. The balled end is cooled into a ball lens. This report employs and compares coreless lensed fibers and GI lensed fibers.

The coreless fiber means a fiber without the core-cladding structure. The core-cladding structure is rather an obstacle when the fiber is changed to be a lens at the end. Thus, the special convenient coreless fiber is employed. An object fiber is a conventional single mode fiber having a core of a 10 μm diameter and a cladding of a 125 μm diameter enclosing the core. The coreless fiber of a 125 μm diameter is made of the same material as the cladding of the single mode fiber. A 1 mm long coreless fiber is fused with a single mode fiber. The coreless end is heated by the oxygen-hydrogen flame into a ball lens.

The GI fiber is a graded-index fiber having a core of continually decreasing refractive index in the radial direction down to the refractive index of the cladding at the boundary. Both the ball-lensed coreless fiber and the ball-lensed GI fiber can be coupled to the SSC-LD with small coupling loss.

However, the coupling by the ball-lensed fibers has some drawbacks. It is difficult to fuse a short, tiny fiber to an end of a narrow single-mode fiber. The end is melted into a ball lens by the oxygen-hydrogen flame. The process depends upon an accident. The diameter of the ball lenses is a stochastic variable. It is difficult to make ball lensed fibers with the predetermined size. The tolerance of the positioning of the end is excessively narrow. It takes much time to align the fiber and the laser diode. The device consisting of the ball lensed fiber and the SSC-LD is a sophisticated device but is not suitable for mass-production. It will be an expensive device. This device aims only at the direct coupling of the fiber to the SSC-LD. The proposal makes the ball lens at the end of the fiber for improving the direct coupling.

The prior art of the SSC-LDs has been described. This invention can be applied to any kinds of the SSC-LDs.

The direct coupling to a fiber is the sole purpose of the SSC-LDs. Thus, the prior SSC-LDs have been stuck either directly to the end of a light waveguide as shown in FIG. 5 or directly to the end of an optical fiber as shown in FIG. 6.

FIG. 5 is a plan view of a horizontally-tapering SSC-LD 18 and a light waveguide 20. The SSC-LD 18 has an active layer 14 having a horizontally narrowing part 16. The light waveguide 20 has a core 21 with a higher refractive index than the cladding parts. The core 21 is coupled to the tapering front end 16 of the SSC-LD 18. The SSC-LD 18 is directly joined to the waveguide 20 without lens. The light made in the parallel active layer 14 by the injected current is enlarged in the tapering portion 16 in spot size but is diminished in aperture angle. The narrow aperture angle allows the LD light to enter the core 21 of the light waveguide 20 with high efficiency.

FIG. 6 is a vertically sectioned view of a vertically-tapering SSC-LD 19 and an optical fiber 22. The SSC-LD 19 has an active layer 14 having a vertically narrowing part 15. The fiber 22 has a core 23 with a higher refractive index than the cladding parts. The core 23 is coupled to the tapering front end 15 of the SSC-LD 19. The SSC-LD 19 is directly joined to the fiber 22 without lens. The light made in the parallel active layer 14 by the injected current is enlarged in spot size but is diminished in aperture angle in the tapering portion 15. The narrow aperture angle allows the LD light to enter the core 23 of the fiber 22 with high efficiency.

The SSC-LDs have been contrived for coupling to a fiber or a waveguide with a small NA (Numerical Aperture) with high coupling efficiency. The SSC-LD dispenses with a lens for coupling with the fiber or the waveguide. The small aperture angel prevents the LD beam from dispersing out of the waveguide or the fiber. The omission of lens is the most important object of the SSC-LDs. The skilled believes there is no room for a lens in the coupling between the SSC-LD and the fiber/waveguide. "Non-lens coupling" is the most conspicuous character of the SSC-LDs.

On the contrary, the conventional LD module as shown in FIG. 1 has an LD which emits a wide aperture angle (30 degrees to 40 degrees) beam. The converging lens 9 is indispensable in the LD module. The lens 9 is a ball lens, a spherical lens or an aspherical lens which is chosen in accordance with the purpose or performance.

In the conventional LD modules (transmission modules), the choice of a ball lens or an aspherical lens depends upon the low-power/low-cost or the high-power/high-cost. Namely, low-cost and low-power LD modules have cheap ball lenses. High-cost/high-power LD modules are equipped with sophisticated aspherical lenses in the prior optoelectronic devices. One purpose of the present invention is to provide a low-cost ball-lens LD module which can generate light power as high as the conventional high-cost aspherical lens LD modules. Another purpose of the present invention is to provide an aspherical lens LD module which can generate stronger light power than the conventional high-cost aspherical lens LD modules.

SUMMARY OF THE INVENTION

The present invention proposes an LD module having a spot-size conversion LD with a narrow beam aperture angle (of 10 degrees to 20 degrees), a light guide medium (a fiber or a waveguide) and a lens for converging the LD light to an end of the light guide medium. The novelty lies in the coupling of an SSC-LD and a lens.

The spot-size conversion laser diodes have been known to the skilled, as described hitherto. The module of a conventional LD and a lens shown in FIG. 1 is also known to the skilled. The present invention proposes a new coupling of an SSC-LD and a lens which will be obtained from FIG. 1 by replacing the conventional LD by the SSC-LD. In short, the present invention suggests an assembly of (SSC-LD+lens) instead of (LD+lens).

The SSC-LDs have been developed and investigated for eliminating the converging lens. The skilled in art believes that there is no probability of interposing a lens between the SSC-LD and the fiber. In any cases, the SSC-LDs have been directly coupled to the fibers or the waveguides.

The Inventors hit an idea of applying positively the converging optics (lens) to the spot-size conversion laser diode which can do without lens.

Instead of joining the SSC-LD directly to the medium (fiber/waveguide), this invention tries to couple the SSC-LD via a lens to the medium (fiber/waveguide). Namely, the module of the present invention is an air-gaped coupling system consisting of an SSC-LD, a lens and a medium which are separated by air gap.

The aperture angle of the beam emitted from the SSC-LD is so narrow that even a ball lens is nearly free from spherical aberration. The SSC-LD enables a cheap ball lens to converge almost all the LD rays. The present invention can introduce higher power into the medium than the conventional LD module as shown in FIG. 1. This is an important feature which will be later described in detail.

The rate of the LD spot size to the fiber/waveguide core is reduced to about a half. The length of the module can be shortened.

If a cap having a lens as shown in FIG. 1 is employed, the LD module is completely hermetically sealed, which raises the reliability of the LD module. The metal package which is a standardized inexpensive metal case can be used. Thus, the present invention can give a low-cost, high-power LD module.

The advantages of the present invention are described here. The present invention succeeds in raising the LD/medium coupling efficiency by 50% to 100% by employing the SSC-LD emitting a beam of a wide spot size and a narrow aperture angle.

Lower injection current produces the same light power as the conventional module of FIG. 1. The present invention saves the current and alleviates the electric power consumption. The low driving current prolongs the lifetime of the laser and enhances the reliability of the module.

Inherently, the SSC-LDs have been developed for the purpose of removing the converging lens and directly coupling the medium to the LD. Any persons have believed in the lensless, direct coupling of the SSC-LD to the medium. The Inventors have first noticed the excellent indirect lens-used coupling of the SSC-LD to the medium.

BRIEF DESCRIPTION OF THE DRAWINGS

FIG. 8 is beam loci calculated by the beam tracing method in an optical system consisting of an LD and a lens.

FIG. 9 is a sectional view of the optical system having an LD, a lens and a lens holder for showing the beam loci depicted in FIG. 8 in the optical system.

DETAILED DESCRIPTION OF THE PREFERRED EMBODIMENTS

Any types of lenses can be applied to the converging optics of the present invention. A ball lens, a spherical lens or an aspherical lens is available. A ball lens is a transparent ball which has large aberration. A spherical lens has both surfaces which are portions of spheres. Both surfaces can be defined simply by a curvature or a curvature radius. Aberration also accompanies the spherical lens. An aspherical lens has surfaces which cannot be described as a part of a simple sphere. The surface should be expressed as a function of radius (r) containing high even number order powers of radius (r). One aspherical surface requires eight to ten parameters to determining the shape. The aspherical lens can remove some aberration. But complicated finishing raises the cost of manufacturing.

Figure 12:
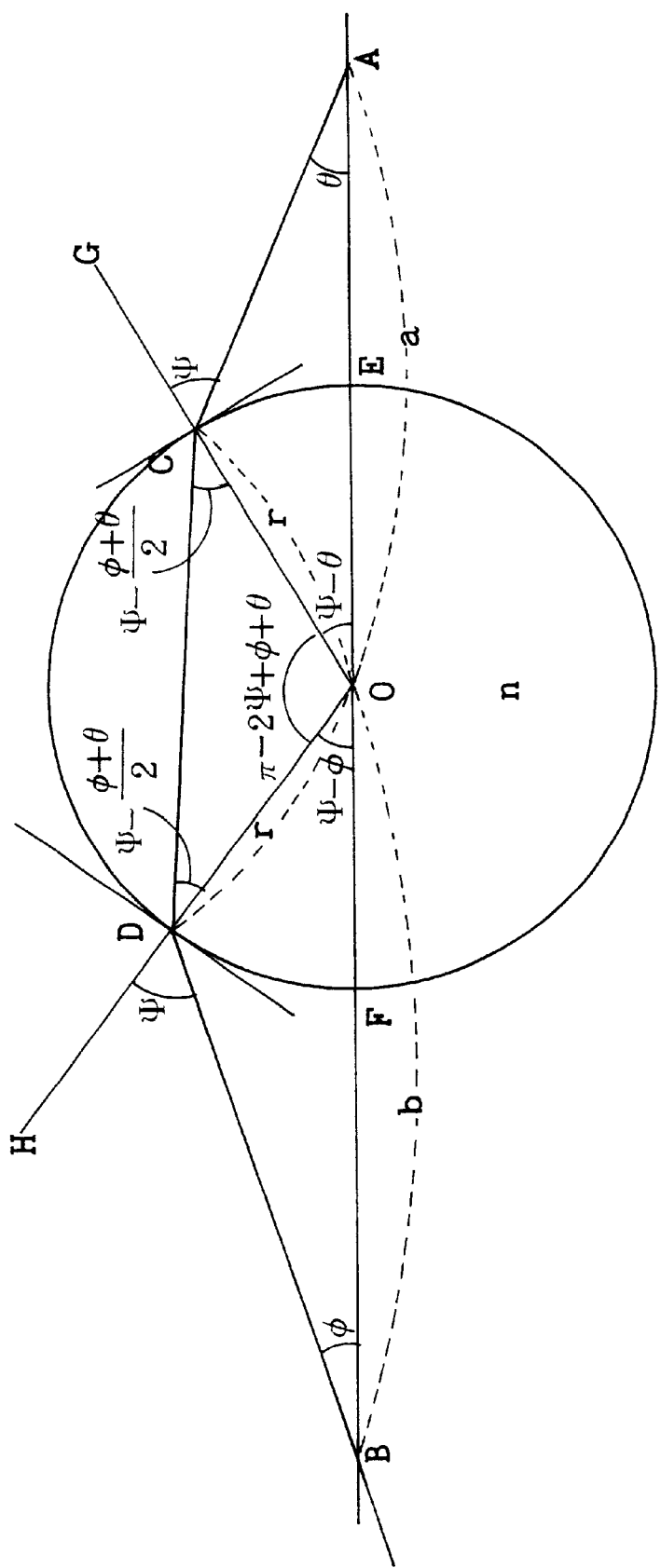
FIG. 12 is an explanatory figure for analyzing the refraction of beams in a ball lens.

This invention can be applicable to any kinds of lenses. The most cost-effective case is an application to the cheap ball lenses. Although they are inexpensive, the ball lenses have the large spherical aberration which differs the convergence points for the near-axis rays and for the far-axis rays. The strong spherical aberration disperses the converging points wide along the axial line. How much does the spherical aberration occur in a ball lens? The degree of the actual spherical aberration will be now calculated. FIG. 12 is an explanatory figure for clarifying the refraction of a ray at a ball lens.

Point "O" is the center of a ball lens. Point "A" means a front spot of an LD which emits the ray. The emission Point A is a uniquely-determined point. A ray starts from Point A at an angle θ (emission angle). The ray is refracted at Point C on the surface of the ball lens. The ray propagates in the lens. The ray is again refracted at Point D on the surface. The refracted ray crosses the axial line at Point B. B is an image point. But B is not a unique image point due to the aberration. The crossing Point B depends upon the emission angle θ. The rays with smaller angles than θ are called "near-axis rays". The rays with larger angles than θ are called "far-axis rays". Point G is defined at an extension of Line OC drawn from the center O to the refraction point C. Point H is defined at an extension of Line OD drawn from the center O to the refraction point D. The refracted ray DB crosses the axial line with an angle æ at B.

The distance between the center O and the emission point A is denoted by "a" (OA=a). The distance between the center O and the image point B is denoted by "b" (OB=b). The radius of the ball lens is denoted by "r". Triangle CDO is a isosceles triangle (OD=OC). The bottom angles are equal.

$$\angle OCD = \angle ODC. \tag{9}$$

The refractive index of the lens is denoted by "n". Snell's law teaches us, $$n \sin \angle OCD = \sin \angle GCA. \tag{10}$$

$$n \sin \angle ODC = \sin \angle HDB. \tag{11}$$

Eq.(9) to Eq.(11) show us that ∠GCA is equal to ∠HDB. Then, Ψ is now defined as $$\Psi = \angle HDB = \angle GCA. \tag{12}$$

In the triangle AOC, the sum of two inner angles is equal to the outer angle of the third corner.

$$\angle COA = \angle GCA - \angle CAO = \Psi - \theta. \tag{13}$$

In the triangle BDO, the sum of two inner angles is equal to the outer angle of the third corner.

$$\angle DOB = 110\ HDB - \angle DBO = \Psi - \phi. \tag{14}$$

Since the sum of ∠COD, ∠COA and ∠DOB is π (180 degrees), $$\angle COD = \pi - 2\Psi + \phi + \theta. \tag{15}$$

The triangle OCD is an isosceles triangle, $$\angle OCD = \angle ODC = \Psi - (\Psi + \theta)/2. \tag{16}$$

The sine theorem is applied to the triangle OCA.

$$a/\sin\Psi = r/\sin\theta. \tag{17}$$

The sine theorem is applied to the triangle ODB.

$$b/\sin\Psi = r/\sin\phi. \tag{18}$$

Eq.(17) determines θ.

$$\theta = \sin^{-1}\{(r/a)\sin\Psi\}. \tag{19}$$

Eq.(18) determines ø.

$$\phi = \sin^{-1}\{(r/b)\sin\Psi\}. \tag{20}$$

Eq.(10) and Eq.(11) are unified to, $$\sin\Psi = n\sin\left\{\Psi - \frac{\sin^{-1}\left(\frac{r\sin\Psi}{a}\right) + \sin^{-1}\left(\frac{r\sin\Psi}{b}\right)}{2}\right\}. \tag{21}$$

This is an exact equation ruling the relation among a, b and Ψ. This equation is free from approximation. Here, Ψ is the incidence angle at C and the outlet angle at D.

The near-axis ray approximation forces us to take the limits θ, ø, Ψ→0. The near-axis ray approximation brings about a simple formula ruling a, b and Ψ, which will be described later.

As the rays separate from the axial line, θ, ø and Ψ increase. When Line AC is a tangential line to the lens surface, the far-axis rays reach the outer limit. When Line AC is a tangential line, Line OG is vertical to Line AC. The far-axis limit gives Ψ=π/2 (90 degrees). The far-axis limit of θ is $\sin^{-1}$ (r/a). Namely, the tendency from the near-axis to the far-axis is denoted by a change of Ψ from θ to π/2 and an equivalent change of θ from 0 to $\sin^{-1}$ (r/a).

Variation Range θ:0~$\sin^{-1}$(r/a). (22)

Variation Range Ψ:0~π/2. (23)

[a. near-axis approximation]

The near-axis approximation, which brings Ψ close to 0, reduces Eq.(21) to, $$\sin^{-1}(r/a)+\sin^{-1}(r/b)=2\{1-(1/n)\} \qquad (24)$$

A further approximation in which r/a and r/b should be far smaller than 1, gives a simple approximation formula.

$$\frac{r}{a}+\frac{r}{b}=2\left(1-\frac{1}{n}\right). \qquad (25)$$

This approximation form allows the system to define a focal length $f_1$.

$$\frac{1}{f_1}=\frac{2}{r}\left(1-\frac{1}{n}\right). \qquad (26)$$

[b. far-axis approximation]

The far-axis approximation, which brings Ψ close to π/2 (sinΨ=1), reduces Eq.(21) to, $$1/n=\cos\{(\sin^{-1}(r/a)+\sin^{-1}(r/b))/2\}. \qquad (27)$$

Equivalently, $$2\cos^{-1}(1/n)=\sin^{-1}(r/a)+\sin^{-1}(r/b). \qquad (28)$$

Eq.(24) denotes the near-axis limit approximation. Eq.(27) shows the far-axis limit approximation. Comparison of Eq.(24) and Eq.(27) teaches us that the replacement of $2\{1-(1/n)\}$ in Eq.(24) by $2\cos^{-1}$ (1/n) produces Eq.(28). Since n>1, $$2\{1-(1/n)\}<2\cos^{-1}(1/n). \qquad (29)$$

The value $\{\sin^{-1}(r/a)+\sin^{-1}(r/b)\}$ takes a bigger value for the far-axis rays than the near-axis rays. Since the radius "r" and the distance "a" are common for both types of rays, the far-axis rays take smaller "b" and the near axis-rays take larger "b". This discrepancy is the spherical aberration of the ball lens.

Furthermore, some refracted rays cannot escape from the lens. When the light source is separated from the lens by an indefinite distance (a=infinitive), there is a critical refractive index $n_c$. The critical refractive index $n_c$ is obtained from Eq.(28) by substituting b=r and a=infinitive.

$$n_c=2^{1/2}=1.414. \qquad (30)$$

This means that the rays coming from the infinitive distance are enclosed within the lens having a refractive index ($1<n<n_c$) between 1 and 1.414 and cannot go out of the ball lens again.

When the light source approaches the lens, $\sin^{-1}(r/a)$ increases. Some refracted rays can escape from the lens of $n<n_c$ for a definite "a". When n is large, the approach of the light source close to the lens prohibits the refractive rays from going out of the lens. Such a critical source·lens distance $a_c$ is obtained from Eq.(28) by substituting b/r=1, $$a_c=\frac{-r}{\cos\left\{\frac{2}{\cos(1/n)}\right\}}. \qquad (31)$$

For n=1.5, the ball lens gives the critical distance $a_c$, $$a_c=9r \qquad (32)$$

Thus, a should be a>9r.

However, usually the LD has a narrow aperture. The far-axis rays are not tangential to the lens. Namely, the maximum of Ψ is not 90 degrees but smaller than 90 degrees in usual cases.

Eq.(21) is an exact formula. It is difficult to solve analytically and exactly Eq.(21) with Ψ. Dividing Eq.(21) by n, taking arc sine of the both terms, transferring Ψ, transforming Ψ=$\sin^{-1}$(sinΨ), multiplying the both terms by two, we obtain, $$2\left[\sin^{-1}(\sin\Psi)-\sin^{-1}\left\{\left(\frac{1}{n}\right)\sin\Psi\right\}\right]=\sin^{-1}\left(\frac{r\sin\Psi}{a}\right)+\sin^{-1}\left(\frac{r\sin\Psi}{b}\right). \qquad (33)$$

When z is far smaller than 1, an approximating expansion of $\sin^{-1}z$ gives $$\sin^{-1}z=z+z^3/6+ \qquad (34)$$

Eq.(33) can be revised by substituting z=sin Ψ into (33).

$$2\left\{\sin^{-1}z-\sin^{-1}\left(\frac{z}{n}\right)\right\}=\sin^{-1}\left(\frac{rz}{a}\right)+\sin^{-1}\left(\frac{rz}{b}\right). \qquad (35)$$

By using Eq.(34), Eq.(35) is approximated into, $$2z\left(1-\frac{1}{n}\right)+\frac{z^3\left(1-\frac{1}{n^3}\right)}{3}=\frac{rz}{a}+\frac{rz}{b}+\frac{\left(\frac{rz}{a}\right)^3}{6}+\frac{\left(\frac{rz}{b}\right)^3}{6}. \qquad (36)$$

By dividing Eq.(36) by z, and separating the terms without z and the terms including z, we obtain, $$\frac{r}{a}+\frac{r}{b}-2\left(1-\frac{1}{n}\right)=-z^2\left\{-\frac{1}{3}\left(1-\frac{1}{n^3}\right)+\frac{\left(\frac{r}{a}\right)^3}{6}+\frac{\left(\frac{r}{b}\right)^3}{6}\right\}. \qquad (37)$$

The 0-th order approximation, which does not include z, of Eq.(37) is, $$(r/a)+(r/b)=2\{1-(1/n)\}. \qquad (38)$$

Replacing r/a=1−(1/n) and r/b=1−(1/n) in the right hand term of Eq.(37), we obtain the second order approximation;

$$\frac{r}{a}+\frac{r}{b}-2\left(1-\frac{1}{n}\right)=-z^2\left\{-\frac{1}{3}\left(1-\frac{1}{n^3}\right)+\frac{1}{3}\left(1-\frac{1}{n}\right)^3\right\} \qquad (39)$$

-continued $$= \frac{z^2}{n}\left(1 - \frac{1}{n}\right).$$

The second order equation is $$(r/a)+(r/b)=2\{1-(1/n)\}\{1+(z^2/2n)\}. \tag{40}$$

Where $z=\sin\Psi$. The term $(z^2/2n)$ is the second order correction.

When the light source is put at Point a, the rays are converged at Point b which depends upon the inclination angle $\Psi$ (or $\theta$). The near-axis converging point $b_0$ is given by $$(r/a)+(r/b_0)=2\{1-(1/n)\}. \tag{41}$$

A general converging point b is differently determined by, $$(r/a)+(r/b)=2\{1-(1/n)\}\{1+(z^2/2n)\}. \tag{42}$$

The difference of the general converging point b from the near-axis ray converging point $b_0$ is $$(r/b)-(r/b_0)=2\{1-(1/n)\}(z^2/2n). \tag{43}$$

This signifies the dependence of the converging point b upon $\Psi(z=\sin\Psi)$. For example, if the lens system has parameters of n=1.5, r=750 μm, a=1600 μm, the near-axis rays ($\Psi$=0) converge at $$b_0 = 3790 \text{ μm}. \tag{44}$$

But the rays of a general $\Psi$ converge at $$b = 3790/(1+1.123z^2) \text{ μm}. \tag{45}$$

For example, the conventional LD emits a beam of a wide aperture of 36 degrees ($\theta$=18 degrees). In this case, the outermost ray is defined by $z=\sin\Psi=(a/r)\sin\theta=0.659$. The converging point b is $$b = 2546 \text{ μm (for } \theta=18 \text{ degrees; aperture angle=36 degrees)}. \tag{46}$$

The converging point (b=2546 μm) of the farthest-axis rays is shorter by 1244 μm than the near-axis converging point $b_0$ ($b_0$=3790 μm). Namely, the converging points distribute in a 1244 μm length along the axial line in the conventional LD module with the 36 degree aperture angle. The wide distribution of the converging points prohibits much portion of the refracted rays from entering into the fiber as the propagating rays.

On the contrary, the SSC-LD of the present invention has a narrow aperture angle e.g., $2\theta$=12 degrees. For the outermost ray of $\theta$=6 degrees, $z=(a/r)\sin\theta=0.223$. The converging point b is $$b = 3590 \text{ μm (for } \theta=6 \text{ degrees; aperture angle=12 degrees)}. \tag{47}$$

The converging point (b=3590 μm) for the farthest-axis rays is shorter by 200 μm than the near-axis rays. The SSC-LD emits the beam in which the ratio of the near-axis rays is far bigger than 0.5. The converging points distribute only in a 200 μm length along the axis. The dispersion of the converging points in the present invention is about one sixth of the conventional LD modules. The much denser distribution of the converging points allows the refracted rays to go into the fiber with far higher efficiency. The spherical aberration is fully suppressed by the present invention which makes the best use of the SSC-LD. The suppress of the spherical aberration enables the invention LD module to introduce stronger light power into the fiber than the conventional LD module.

Figure 7:
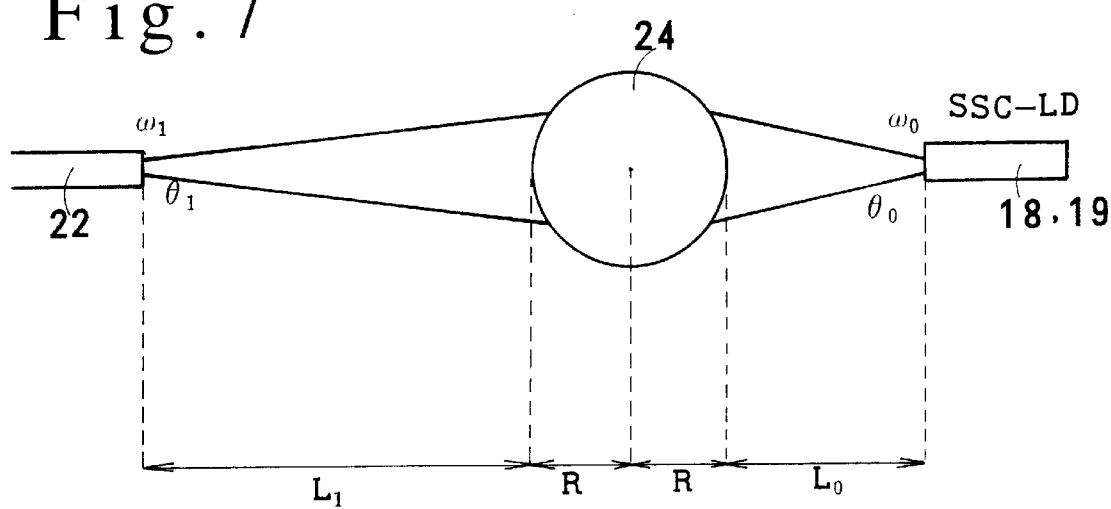
FIG. 7 is a front view of an indirect coupling between a single-mode fiber and a spot size conversion laser diode (SSC-LD) intervened by a ball lens.

EMBODIMENT 1 (Ball lens+SSC-LD; FIG. 7)

Figure 1:
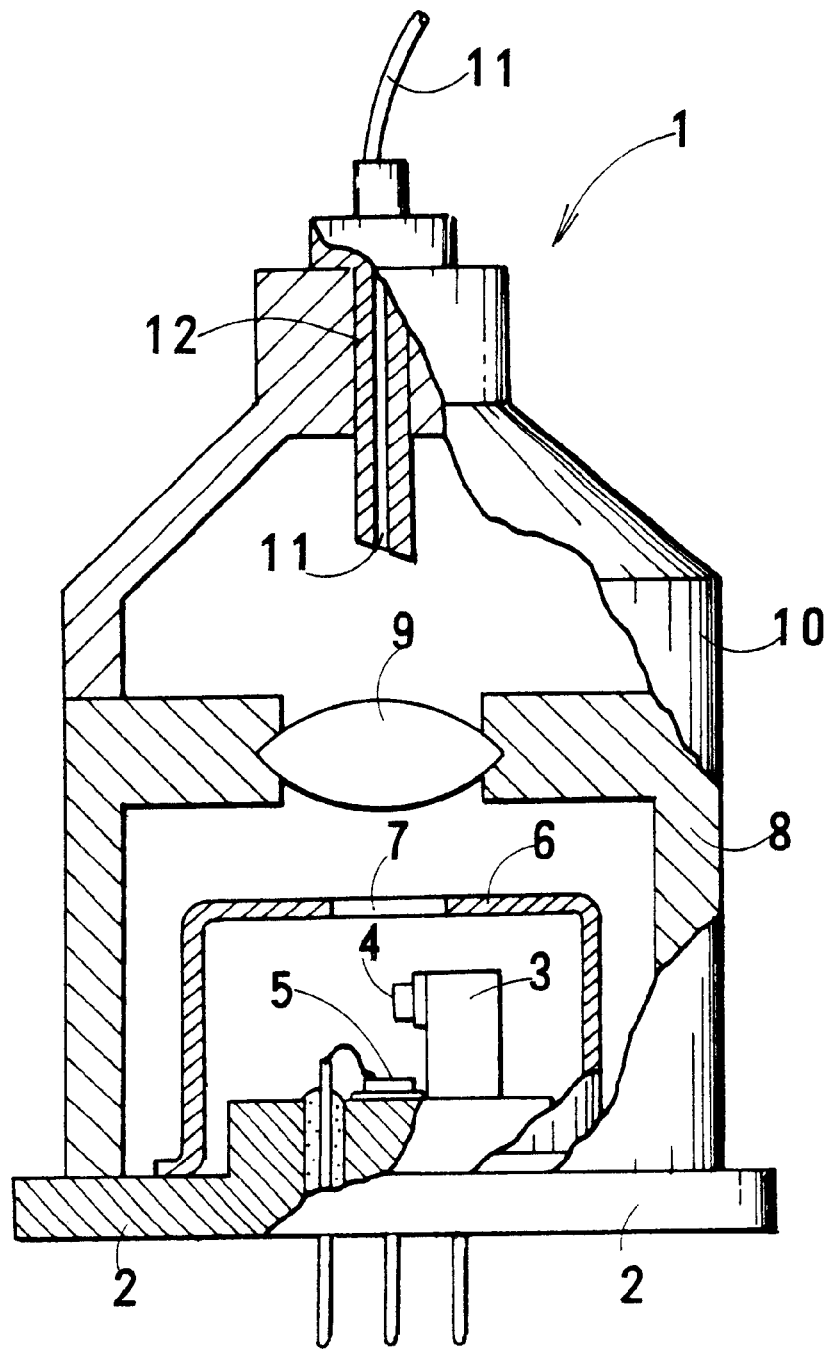
FIG. 1 is a vertically-sectioned view of a prior art LD module.
Figure 2:
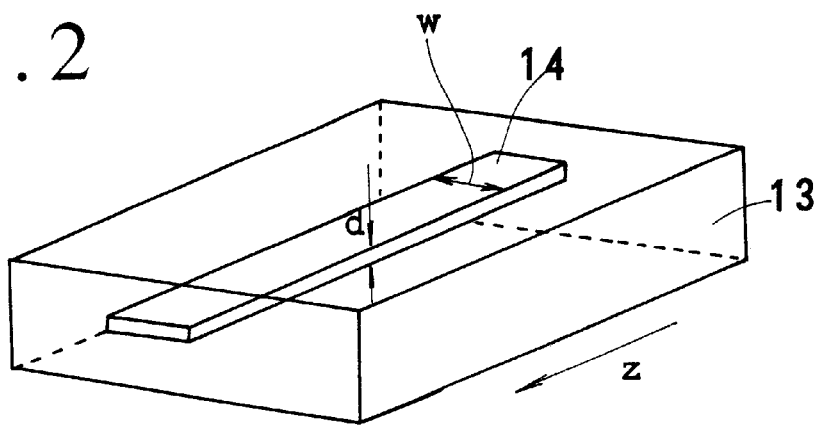
FIG. 2 is a schematic perspective view of a conventional laser diode (LD) having an active layer (stripe) with a constant width w and a constant thickness d.
Figure 3:
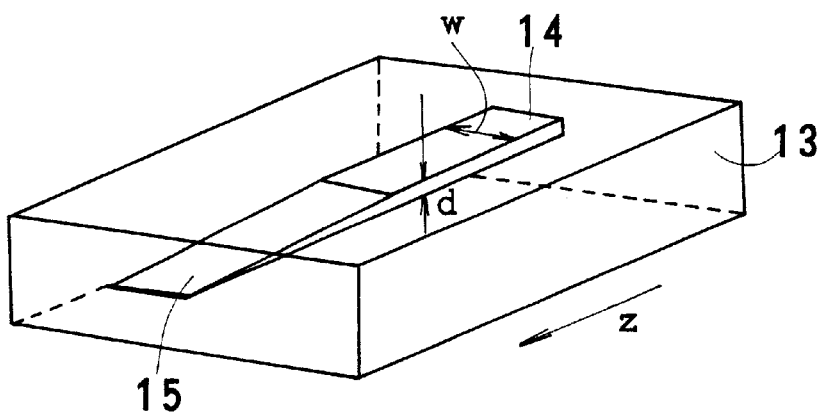
FIG. 3 is a schematic perspective view of a vertically-tapered spot size conversion laser diode (SSC-LD) having an active layer (stripe) with a constant width w and a thickness d narrowing toward the front end in the longitudinal direction.
Figure 4:
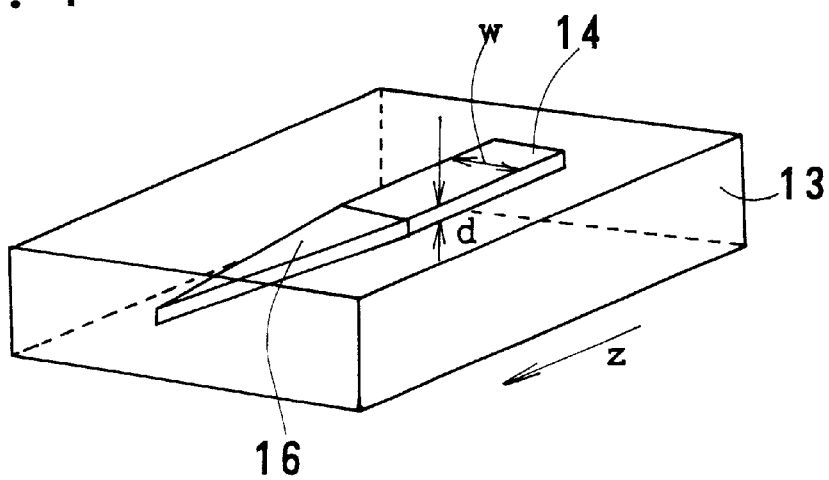
FIG. 4 is a schematic perspective view of a horizontally-tapered spot size conversion laser diode (SSC-LD) having an active layer (stripe) with a constant thickness d and a width d narrowing toward the front end in the longitudinal direction.
Figure 5:
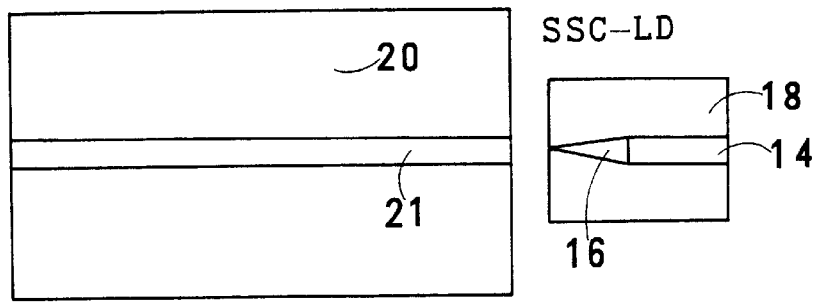
FIG. 5 is a plan view of a light waveguide with a core of a higher refractive index and a horizontally-tapered spot size conversion laser diode (SSC-LD) directly coupled to the waveguide.
Figure 6:
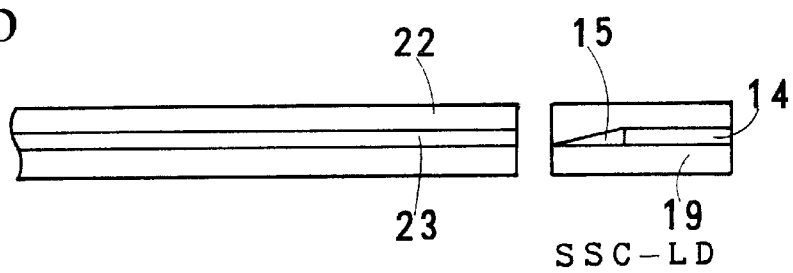
FIG. 6 is a vertically-sectioned view of a single-mode fiber with a core of a higher refractive index and a vertically-tapered spot size conversion laser diode (SSC-LD) directly coupled to the waveguide.

FIG. 7 shows Embodiment 1 which employs a ball lens as a converging lens. A ball lens 24 and an SSC-LD 18 (or 19) are aligned on an extension of a single-mode optical fiber 22. Here, the SSC-LD 18 is a horizontally-tapered SSC-LD (FIG. 5) and the SSC-LD 19 is a vertically-tapered SSC-LD (FIG. 6). Both are similarly available.

"$L_0$" is a distance between the ball lens 24 and the LD 18 (or 19). "$L_1$" is a distance between the fiber 22 and the lens 24. "R" is a radius of the ball lens 24. "$\theta_0$" is an aperture angle of the LD beam. "$\theta_1$" is an aperture angle of the fiber 22. "$\omega_0$" is a beam waist (least section) of the LD beam. "$\omega_1$" is a beam waist (least section) of the fiber beam. The beam waist means the least diameter of the sections of the beam. The beam waist corresponds to the sizes of images. The LD beam waist "$\omega_0$" is converted by the lens 24 to the fiber beam waist "$\omega_1$". The magnifying rate of the lens is given by $\omega_1/\omega_0$. The $\omega_0$ is small since the emitting beam from the narrowing active stripe LD has a small beam waist. The $\omega_1$ is large since the fiber core has a 10 μm diameter. If the waist $\omega_1$ should be determined to nearly equal to the fiber core (10 μm) for introducing the light into the fiber with high coupling efficiency, emitting beam from the narrowing active stripe LD has a small beam waist. Then, a good coupling is accomplished by equalizing the magnifying rate to the ratio of the fiber core section to the LD stripe section. The magnifying rate is given by the ratio of the lens center·fiber distance to the lens center·LD distance.

$$\text{magnifying rate} = \frac{\omega_1}{\omega_0} = \frac{L_1 + R}{L_0 + R}. \tag{48}$$

Of course, this condition is valid when the image of the LD is formed at the end of the fiber by the lens. For the current fiber and the typical LD, the magnifying rate and the distances are tentatively calculated here.

In Embodiment 1, the radius of the ball lens is 750 μm. The refractive index is 1.5. An antireflection film is coated upon the ball lens.

The optical fiber is a single-mode fiber (SMF) having a 10 μm diameter core for 1.3 μm light.

The distance between the LD and the center of the lens is 1600 μm. The distance between the lens center and the fiber end is 3400 μm. Two LD modules are made for clarifying the advantages of the present invention. Module (A) is equipped with the (conventional) LD(A) of a 35 degree aperture angle. Module (B) is furnished with the spot size converted LD(B) of a 12 degree aperture angle. The LD(A) and LD(B) have the following characteristics.

LD(A) . . . active layer width 1.0 μm,
  active layer thickness 0.2 μm,
  active layer length 300 μm,
  beam aperture angle 35 degrees.

LD(B) . . . active layer width (rear end) 1.5 μm,
  active layer width (front end) 0.5 μm,
  active layer thickness 0.2 μm,
  active layer length 300 μm,
  beam aperture angle 12 degrees.

The front ends of both LDs are cleavage planes. The rear ends of the LDs are also cleavage planes and are coated with dielectric multilayers of a 90% reflection rate. When an injection current is supplied to the LDs, pairs of electron and hole are made by the current. Recombination of the holes and electrons produces photons (light quanta). The light, an assembly of photons, reciprocates in a resonator consisting of the front end mirror and the rear end mirror. The light is amplified by the injection current into strong in-phase light in the reciprocal movement. The front end emits signal light. The rear end emits monitoring light.

The SSC-LD (B) is common to the LD(A) in chip size, shape, end coating, cavity length and active layer thickness. Only the shape of the active layer is different. The LD(B) has a stripe layer having a narrowing width, which reduces the beam aperture to 12 degrees (a third of the LD(A)).

Module (A) and Module (B) are driven by 30 mA injection currents. The output power of the LD(A) and LD (B) are equal. The light power at the farther end of the fiber is 0.5 mA for Module (A) and 0.7 mA for Module (B). The difference results from the difference of the coupling among the LD, the lens and the fiber. The present invention (Embodiment 1) obtains light power 40% stronger than the conventional module at the farther fiber end. This is a big difference.

The advantage derives from the fact that the narrow aperture angle of the SSC-LD gathers energy to the near-axis rays which the ball lens can converge at a point without aberration. This is important. Big aberration accompanies a ball lens due to the large curvature although the ball lens is cheap and easy for handling. The aberration has five Seidel's aberrations and chromatic aberration. The chromatic aberration does not matter since the LDs emit monochromatic light. Seidel's aberrations mean spherical aberration, coma, astigmatism, image distortion and image curvature. The role of the lens of the LD module converges monochromatic rays into a fiber. The four aberrations of coma, astigmatism, image distortion and image curvature induce no problem. Only the spherical aberration matters. The spherical aberration means that the converging points are different for the near-axis rays and the far-axis rays. The spherical aberration accompanies all spherical lenses which consist of spherical surfaces (parts of spheres). A ball lens is a kind of the spherical lenses. The ball lens should not be confused with the spherical lens itself.

In a spherical lens, the refraction angles are small near the axis due to the small inclination of the surfaces. The convergence point for the near-axis rays is farther from the lens. On the contrary, the refraction angles are large far from the axis due to the steep inclination of the surfaces. The convergence point for the far-axis rays is nearer from the lens. The refracted rays do not converge at a single point. The converging points align along the axis in accordance with the distance from the axis. This is the spherical aberration. A thin spherical lens is nearly free from the spherical aberration. But a thick spherical lens has the spherical aberration. The ball lens is the limit of thick lenses which invites the strongest spherical aberration. The ball lens is the lens which produces the biggest spherical aberration among the spherical lenses.

Does the large spherical aberration always prohibit the ball lens from converging the rays emitted from a point? It is not true. The different converging points originate from the coexistence of the near-axis rays and the far-axis rays. If all the light is far-axis rays, the spherical aberration substantially vanishes. If all the light is near-axis rays, the spherical aberration effectively distinguishes. The spherical aberration is entirely got rid of from the ball lens by converting all the light to either the far-axis rays or the near axis-rays. The SSC-LD is deemed as a device of converting all the light into the near-axis rays. The gist of the present invention lies at the concept of vanishing the spherical aberration by converting all the light into the near-axis rays by the SSC-LD. The loci of the rays of the ordinary LD (A) and the SSC-LD(B) are calculated by the beam tracing method.

Figure 8A:
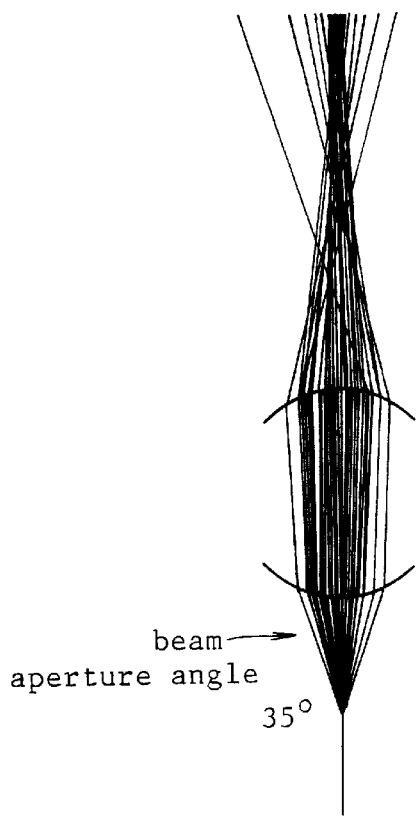
FIG. 8(A) is the loci of the beams which are emitted from a conventional LD with 35 degree beam aperture and are converged by a ball lens.

FIG. 8(A) shows the calculation result of the ray loci of the light emitted from the LD(A) and converged by a ball lens by the beam tracing method. The radius of the ball lens is R=750 $\mu$m. The distance (R+$L_0$) between the LD and the lens center is 1600 $\mu$m. The distance (R+$L_1$) between the lens center and the fiber is 3400 $\mu$m. Module (A) contains far-axis rays far more than near-axis rays due to the large aperture angle (35 degrees) of LD(A). The far-axis rays converge faster on the axial line and diverge again off from the axial line. The near-axis rays converge later on the axial line. The end of the fiber is adjusted at the converging point for the near-axis rays. The far-axis rays which have already begun diverging cannot go into the fiber. The loss of the far-axis rays reduces the coupling efficiency.

Figure 8B:
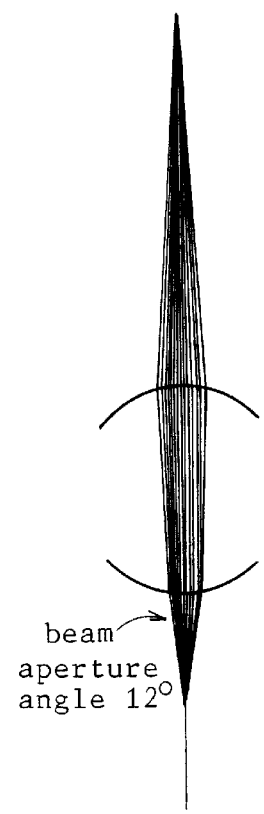
FIG. 8(B) is the loci of the beams which are emitted from an SSC-LD with 12 degree aperture angle and are converged by a ball lens.

FIG. 8(B) shows the calculation result of the ray loci of the light emitted from the LD(B) and converged by a ball lens by the beam tracing method. The radius of the ball lens is R=750 $\mu$m. Module (B) contains near-axis rays far more than far-axis rays due to the narrow aperture angle (12 degrees) of LD(B). All the rays converge at the converging point of the near-axis rays. Nearly all the rays gather on the end of the fiber. Furthermore, the divergence angle is small at the fiber end. The small divergence angle facilitates the entrance of the rays into the fiber. The good convergence of the rays enables the Module (B) to enhance the coupling efficiency by 40% up from the conventional level.

EMBODIMENT 2 (8, 14 and 20 degree aperture angles of LD beams)

Embodiment 1 employed a spot-size conversion laser diode (SSC-LD) of a 12 degree aperture angle. Variation of the tapering angle of the active layer enables the SSC-LD to change the aperture angle of the LD beam arbitrarily. The dependence of the coupling efficiency upon the beam aperture is investigated for three SSC-LDs having 8, 14 and 20 degrees of beam aperture angles.

SSC-LD (C) . . . 8 degree of aperture angle

SSC-LD (D) . . . 14 degrees of aperture angle

SSC-LD (E) . . . 20 degrees of aperture angle

These SSC-LD (C),(D) and (E) bring about high coupling efficiency between 20% and 24%.

For comparison examples, similar LD modules having the conventional LDs (35 degrees to 45 degrees of aperture angles) are made. The comparison examples show low coupling efficiency between 10% and 14%.

The present invention can accomplish coupling efficiency 1.5 to 2 times as high as the conventional LD modules. The present invention can give stronger light power to the fiber than the conventional optical transmission devices (LD modules). An increase of light power enables the communication network to prolong the communication distance, reduce the S/N rate and increase the signal transmission capacity.

EMBODIMENT 3 (Reduction of lens and lens holder; FIG. 8, FIG. 9)

The Inventors are aware of the possibility of giving a conspicuous feature to the LD module by employing the spot-size conversion laser diode (SSC-LD). The SSC-LD enables the LD module to be small sized by reducing the lens and the lens holder under the condition of maintaining the same coupling efficiency.

FIG. 8(A) tells us that the ordinary LD uses a wide region of a lens due to the large aperture angle. FIG. 8(B) teaches us that the SSC-LD uses only a central part of a lens due to the narrow aperture angle. The SSC-LD enables the module to employ a smaller diameter lens having the same curvature radius as the conventional LD. A smaller diameter lens than the conventional lens can be sustained by a smaller lens holder than the conventional lens holder. The small beam aperture of the SSC-LD reduces the whole size of the LD module.

Figure 9A:
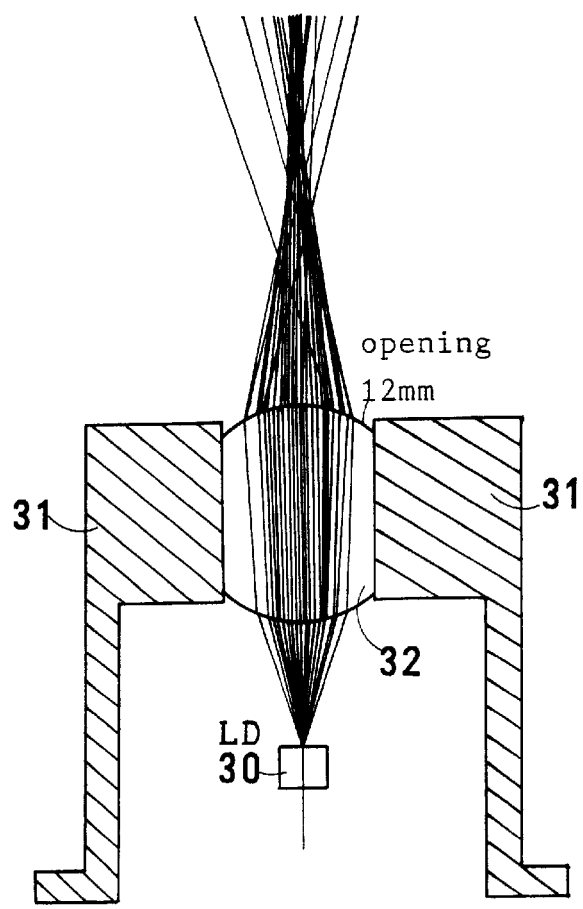
FIG. 9(A) is the loci of the beams which are emitted from a conventional LD with 35 degree beam aperture and are converged by a ball lens supported by a bigger lens holder.
Figure 9B:
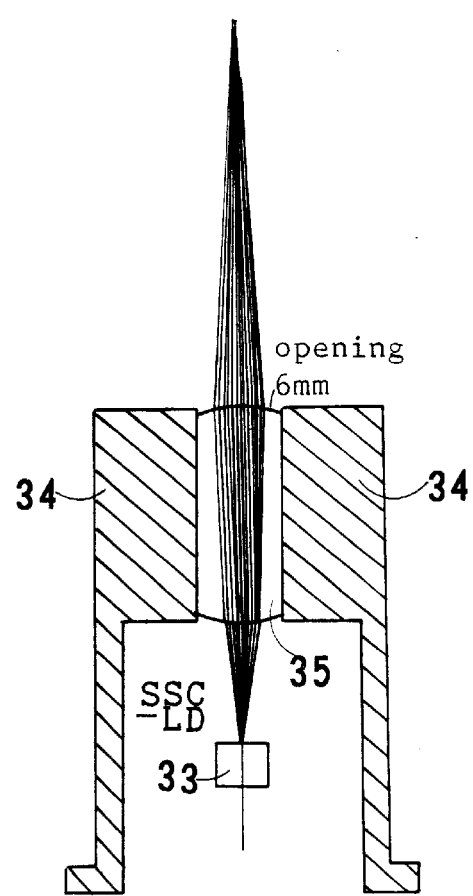
FIG. 9(B) is the loci of the beams which are emitted from an SSC-LD with 12 degree aperture angle and are converged by a ball lens supported by a smaller lens holder.

FIG. 9(A) and FIG. 9(B) are made by adding lens holders to FIG. 8(A) and FIG. 8(B). FIG. 9(A) shows that a wide lens 32 and a large lens holder 31 are necessary to gather wide-dispersing rays emitted from a conventional LD 30. In the conventional module, the opening of the lens holder 31 should be larger than 12 mm in diameter. FIG. 9(B) shows that a small lens 35 and a small lens holder 34 are sufficient to gather narrow aperture rays emitted from an SSC-LD 33. In the SSC-LD module, a 6 mm diameter is sufficient for the opening of the lens holder 34. The SSC-LD 33 enables the lens holder 34 to diminish the size of the opening down to about half The employment of the smaller lens holder can reduce the whole size of the LD module. This is one of the significant advantages of the present invention.

Figure 10:
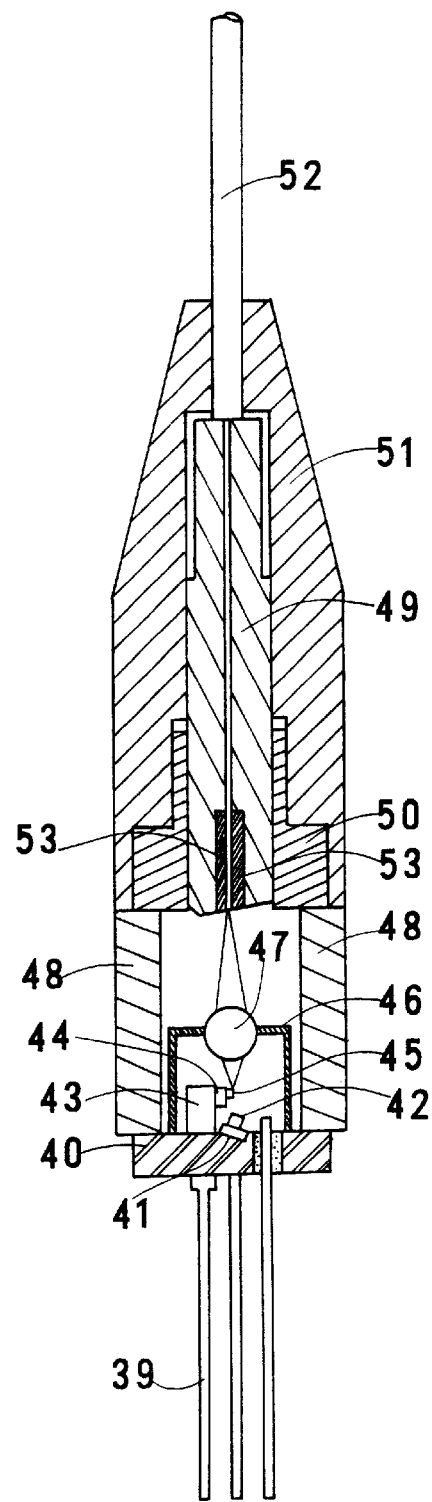
FIG. 10 is a sectional view of a pig-tail type embodiment of the present invention.

EMBODIMENT 4 (Pigtail type module; FIG. 10)

This invention can be applied to any types of modules, since the concept is an assembly of an SSC-LD and a converging lens. FIG. 10 denotes Embodiment 4 of the invention applied to a pig-tail type LD module. The pig-tail type means such a device in which the fiber cannot be separated from the package since an end of the fiber is fixed in a package. Since the fiber dangles from the package like a pig tail, the module is called "pig-tail". An optical connector is attached at another end of the fiber for attaching to or detaching from an outer optical fiber. In FIG. 10, Embodiment 4 has a metallic disc stem 40 with pins 39. A submount 41 and a monitoring PD 42 are fitted at the center on the metallic stem 40. A metallic pole 43 is erected on the stem 40. A submount 44 and an LD (laser diode) 45 are fitted on a side of the pole 43. The LD 45 bidirectionally emits light upward and downward. A metal cap 46 having a ball lens 47 is welded on the stem 40 for covering the LD 45 and the PD 42.

A metallic cylindrical sleeve 48 is welded upon the stem 40 coaxially with the cap 46. A cylindrical ferrule holder 50 is welded upon the top of the sleeve 48 for keeping a ferrule 49. The ferrule 49 maintains an end of an optical fiber 52. The ferrule holder 50 and the ferrule 49 are inserted into an elastic bend-limiter 51. The ferrule 49 has a plug 53 at the front end for holding the cladding of the fiber.

The bend-limiter 51 prevents the fiber cord 52 from curving excessively by maintaining the fiber cord by the axial hole. The beam emitted from the LD 45 is converged by the lens 47 at the end of the fiber core. The ends of the fiber and the ferrule are polished slantingly for prohibiting the reflected beam from returning to the LD 45. Such a pig-tail type LD module having a conventional LD is known well in the skilled. Embodiment 4 replaces the conventional LD by the SSC-LD. The SSC-LD contains more near-axis rays than the ordinary LD. The ball lens 47 can gather almost all of the near-axis rays to the spot on the fiber end. The ball lens 47 enhances the coupling efficiency between the fiber and the SSC-LD. When the SSC-LD is driven with a 30 mA injection current, the output power at another end of the fiber is 0.7 mW. A conventional pig-tail module having an ordinary LD is also made for comparing the efficiency. When the conventional LD module is driven with a 30 mA injection current, the output power is 0.5 mW. Thus, Embodiment 4 succeeds in obtaining light power 40% stronger than the conventional pig-tail LD module. The extra rise of the light power derives from the novel assembly of the SSC-LD and a lens.

Figure 11:
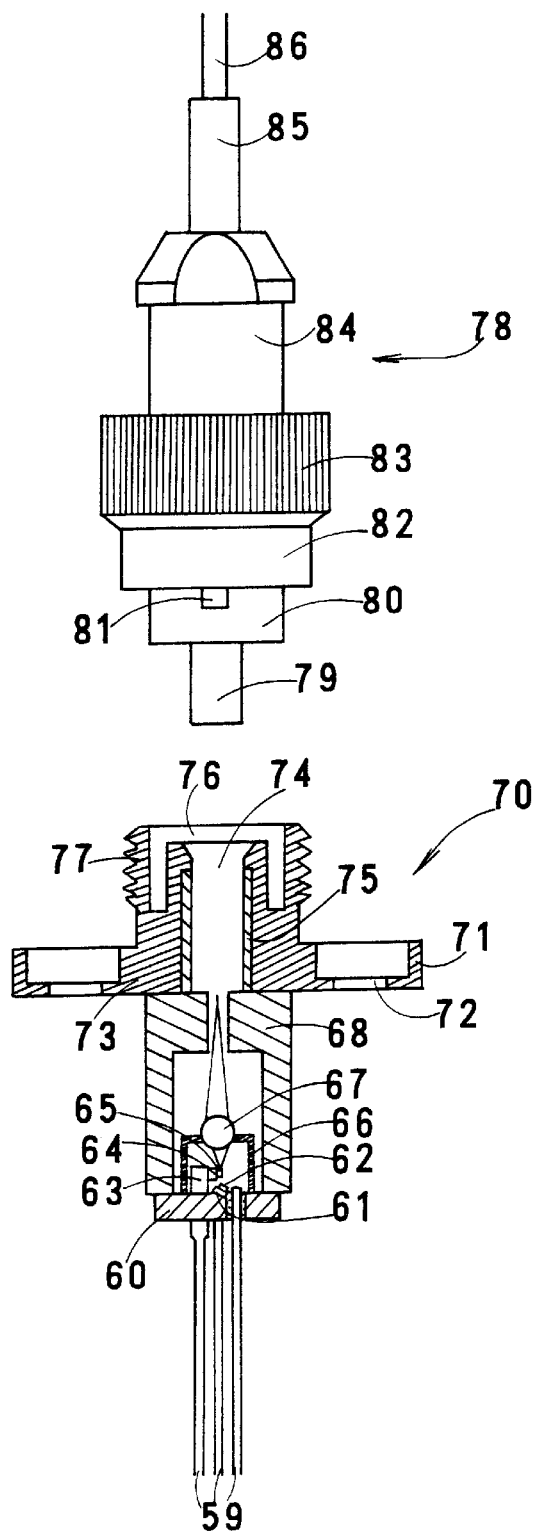
FIG. 11 is a sectional view of a receptacle type embodiment of the present invention.

EMBODIMENT 5 (Receptacle type module; FIG. 11)

FIG. 11 shows another embodiment of the present invention applied to the receptacle type LD module which allows a couple of connectors to attach with and detach from each other.

A metallic round stem 60 has lead pins 59 extending below. A submount 61 and a PD 62 are fitted upon the stem 60. The stem 60 has an erect pole 63. A submount 64 and an LD 65 are mounted on an inner side of the pole 63. A hat-shaped metal cap 66 having a ball lens 67 is welded on the stem 60 for covering the LD 65 and the monitoring PD 62.

A cylindrical metallic sleeve 68 with a narrow top opening is welded upon the metallic disc stem 60. A circular metallic female connector 70 with a hub 73 is welded upon the top of the sleeve 68 at the hub 73. The female connector 70 has a wide round flange 71 at the bottom. Several holes 72 are perforated on the flange 71. An axial hole 74 is bored through the hub 73 of the female connector 70. A tiny sleeve 75 is inserted into the axial hole 74. A round groove 76 is formed around the axial hole 74. A male screw 77 is shaped around an outer cylindrical portion of the female connector 70. The rays emitted from the LD 65 are converged by the lens 67 to a spot at the narrow opening of the sleeve 68.

A male connector 78 carries an optical fiber (cord) 86 which leads the LD signal light to a station. "Receptacle" means the couple of the female connector 70 and the male connector 78. The male connector 78 has a housing 84 and an axial ferrule 79 coaxially. A round collar 80 encloses the axial ferrule 79. The collar 80 will be inserted into the round groove 76 of the female connector 70. A positioning pin 81 is erected at the front end of the female connector 78. A counterpart positioning hole is perforated in the hub 73 of the female connector 70 for determining the angular position of the connectors 78 and 70. A cylindrical nut 82 is loosely fitted around the housing 84 of the male connector 78. An outer surface of the nut 82 wears an anti-slip fringe 83. The ferrule 79 is fixed within an inner hole of the housing 84. An elastic bend-limiter 85 projects from the rear end of the housing 84 for protecting the fiber cord 86 from bending excessively. The optical fiber 86 penetrates the bend-limiter 85, the housing 84 and the ferrule 79.

FIG. 11 denotes a detached state. The connectors 78 and 70 can be attached to each other by inserting the ferrule 79 of the male connector 78 into the axial hole 74 of the female connector 70, putting the positioning pin 81 into the positioning hole of the connector 70, rotating the nut 82 of the male connector 78 around the male screw 77 of the female connector 70 and tightening the nut 82. In the attached state, the front end of the fiber 86 touches the top of the sleeve 68 in the axial hole 74. Namely, the front end of the fiber 86 coincides with the image point. The rays emitted from the LD 65 are converged by the lens 67 at the front end of the fiber in the coupled state. The receptacle type connector is a known module for LD modules or PD modules.

Embodiment 5 is different from the prior art in the kind of the LD. Embodiment 5 makes use of the spot-size conversion laser diode (SSC-LD) instead of the conventional LD. The use of the narrow aperture beam of the SSC-LD raises the rate of the near-axis rays. The narrow aperture beam is further converged by the lens 67. Even a ball lens can gather almost all of the near-axis rays. The assembly of the SSC-LD and the lens well enhances the coupling efficiency. When a 30 mA injection current drives the SSC-LD, the output light power measured at another end of the fiber is 0.7 mW. The light power is sufficiently strong and stable.

A conventional counterpart LD module having a conventional LD is made for comparing the characteristics. The output power of the conventional LD module is 0.5 mW for a 30 mA driving current. Embodiment 5 enables the LD module to obtain light power about 40% stronger than the conventional one.

What we claim is:

1. An LD module comprising:
    a spot-size conversion laser diode (SSC-LD) having a tapering active layer;
    a light propagating medium;
    a lens for converging light emitted from the laser diode to the light propagating medium; and
    a case enclosing the laser diode, the lens and the light propagating medium.

2. The LD module according to claim 1, wherein the light propagating medium is an optical fiber.

3. The LD module according to claim 1, wherein the light propagating medium is a light waveguide.

4. The LD module according to claim 1, wherein the lens is a ball lens.

5. The LD module according to claim 1, wherein the lens is a spherical lens.

6. The LD module according to claim 1, wherein the lens is an aspherical lens.

7. The LD module according to claim 2, wherein the case is a receptacle type case consisting of a female connector storing the LD and the lens.

8. The LD module according to claim 2, wherein the case is a receptacle type case consisting of a female connector storing the LD and the lens and a male connector maintaining an end of the optical fiber.

9. The LD module according to claim 2, wherein the case is a pig-tail type case which maintains an end of the optical fiber.

10. The LD module according to claim 1, wherein the LD is a vertically-tapering spot-size conversion laser diode having an active layer with a thickness narrowing toward an end.

11. The LD module according to claim 1, wherein the LD is a horizontally-tapering spot-size conversion laser diode having an active layer with a width narrowing toward an end.

12. The LD module according to claim 1, wherein the LD is a horizontally/vertically-tapering spot-size conversion laser diode having an active layer with a width and a thickness narrowing toward an end.

13. The LD module according to claim 1, wherein the spot size conversion LD is an InGaAsP-type semiconductor laser.

14. The LD module according to claim 4, wherein the SSC-LD is mounted upon a metallic stem, a cap with the ball lens is fitted to the metallic stem for covering the LD and a metallic holder is welded to the stem for covering the LD, the lens and the cap.

15. The LD module according to claim 5, wherein the SSC-LD is mounted upon a metallic stem, a cap with the spherical lens is fitted to the metallic stem for covering the LD and a metallic holder is welded to the stem for covering the LD, the lens and the cap.

16. The LD module according to claim 6, wherein the SSC-LD is mounted upon a metallic stem, a cap with the aspherical lens is fitted to the metallic stem for covering the LD and a metallic holder is welded to the stem for covering the LD, the lens and the cap.

* * * * *